United States Patent
Chen et al.

(10) Patent No.: US 11,095,826 B2
(45) Date of Patent: Aug. 17, 2021

(54) CAMERA AND LIGHT ADJUSTMENT MODULE

(71) Applicant: Chicony Electronics Co., Ltd., New Taipei (TW)

(72) Inventors: Chien-Yueh Chen, New Taipei (TW); Jin-Kae Jang, New Taipei (TW)

(73) Assignee: Chicony Electronics Co., Ltd., New Taipei (TW)

(*) Notice: Subject to any disclaimer, the term of this patent is extended or adjusted under 35 U.S.C. 154(b) by 0 days.

(21) Appl. No.: 16/595,693

(22) Filed: Oct. 8, 2019

(65) Prior Publication Data

US 2020/0358941 A1  Nov. 12, 2020

(30) Foreign Application Priority Data

May 8, 2019 (TW) .................................. 10811595

(51) Int. Cl.
*H04N 5/235* (2006.01)
*H04N 5/225* (2006.01)
*H05K 1/18* (2006.01)

(52) U.S. Cl.
CPC ........... *H04N 5/235* (2013.01); *H04N 5/2254* (2013.01); *H05K 1/182* (2013.01)

(58) Field of Classification Search
CPC ....... H04N 5/235; H04N 5/2254; H05K 1/182
See application file for complete search history.

(56) References Cited

U.S. PATENT DOCUMENTS

| 5,010,412 A | * | 4/1991 | Garriss | H04N 5/2256 348/371 |
| 6,749,310 B2 | * | 6/2004 | Pohlert | H04N 5/2256 362/11 |
| 7,712,906 B1 | * | 5/2010 | Larimer | G03B 15/05 362/16 |
| 2005/0265707 A1 | * | 12/2005 | Chang | G03B 15/05 396/199 |
| 2008/0087911 A1 | * | 4/2008 | Stoyan | H05K 1/021 257/99 |
| 2009/0268434 A1 | * | 10/2009 | Mita | G02F 1/133608 362/97.1 |
| 2017/0353656 A1 | * | 12/2017 | Ramones | H04N 5/33 |
| 2018/0332204 A1 | * | 11/2018 | Chien | F21V 21/30 |
| 2020/0204710 A1 | * | 6/2020 | Myers | G06K 9/00604 |

FOREIGN PATENT DOCUMENTS

| CN | 208399869 U | 1/2019 |
| GN | 102798002 A | 11/2012 |
| GN | 208399869 U | 1/2019 |

* cited by examiner

*Primary Examiner* — Amy R Hsu
(74) *Attorney, Agent, or Firm* — Muncy, Geissler, Olds & Lowe, P.C.

(57) ABSTRACT

A light adjustment module for camera includes a light source unit and a light adjustment unit. The light source unit includes a plurality of light emitting elements disposed around a lens of the camera, and the light emitting direction of each light emitting element is parallel to the image capturing direction of the lens. The light adjustment unit is disposed above the light source unit and includes a plurality of secondary optical elements, and the secondary optical elements respectively corresponds to the light emitting elements. The light emitted by each light emitting element is deflected through the corresponding secondary optical element.

27 Claims, 6 Drawing Sheets

CAMERA AND LIGHT ADJUSTMENT MODULE

CROSS-REFERENCE TO RELATED APPLICATION

This non-provisional application claims priority under 35 U.S.C. § 119(a) to Patent Application No. 108115958 in Taiwan, R.O.C. on May 8, 2019, the entire contents of which are hereby incorporated by reference.

BACKGROUND

Technical Field

The instant disclosure relates to an electronic device, in particular, to a camera and a light adjustment module for camera.

Related Art

Cameras are utilized along with auxiliary light sources for auxiliary illumination purpose. Hence, when cameras are utilized to capture images, clear images can be obtained by the aids from the illumination of the auxiliary light sources. Moreover, the auxiliary light source provides a sufficient brightness for capturing images at nighttime or insufficient light circumstances.

To allow the auxiliary light source to emit to a certain region or in a certain angle, the light source of the camera known to the inventor is provided with an insertion-type light emitting element having a pin structure (for instance, a DIP LED). During the manufacturing process of the camera, the pin structure of the insertion-type light emitting element is inserted to a circuit board, and then the pin structure is bent and fixed by soldering. Consequently, the insertion-type light emitting element can be oriented to a certain direction so as to emit to a certain region.

SUMMARY

However, the aforementioned procedure is time consuming and complicated (for instance, the bending step is required to be performed to every light emitting element). Furthermore, because the orientation alignment of the light emitting element is achieved by the bending step, the bending step may be performed mistakably to produce defected products, and the defected products may fail to perform the expected illumination performance. Moreover, the light emitted by the insertion-type light emitting element may have a non-uniform illumination; for instance, the light distant from the insertion-type light emitting element may be diffused to provide a poor illumination. As a result, the image quality of the image may be adversely affected.

In view of this, in one embodiment, a light adjustment module for camera is provided, and the light adjustment module is applicable to a camera. The light adjustment module comprises a light source unit and a light adjustment unit. The light source unit comprises a plurality of light emitting elements. The plurality of light emitting elements is disposed around a lens of the camera, wherein a light emitting direction of each of the light emitting elements is parallel to an image capturing direction of the lens. The light adjustment unit is disposed above the light source unit and comprises a plurality of secondary optical elements. The secondary optical elements respectively corresponds to the light emitting elements. A light emitted by each of the light emitting elements is deflected through the corresponding secondary optical element.

In one embodiment, a camera is provided. The camera comprises a camera body and the foregoing light adjustment module. The camera body has a lens, and the light adjustment module is disposed in the camera body.

Based on the above, according to one or some embodiments of the instant disclosure, each secondary optical element of the light adjustment unit corresponds to the corresponding light emitting element, and the light emitted by each light emitting element is deflected through the corresponding secondary optical element. Hence, the light adjustment unit guides the light emitted by each light emitting element to achieve an expected illumination angle and intensity distribution, thereby optimizing the uniformness of the illumination to enhance the image quality of the captured image. Moreover, additional manufacturing processes (e.g., the pin-bending and turning procedure) for each light emitting element 15 are not necessarily required, thereby greatly reducing labor and time cost.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
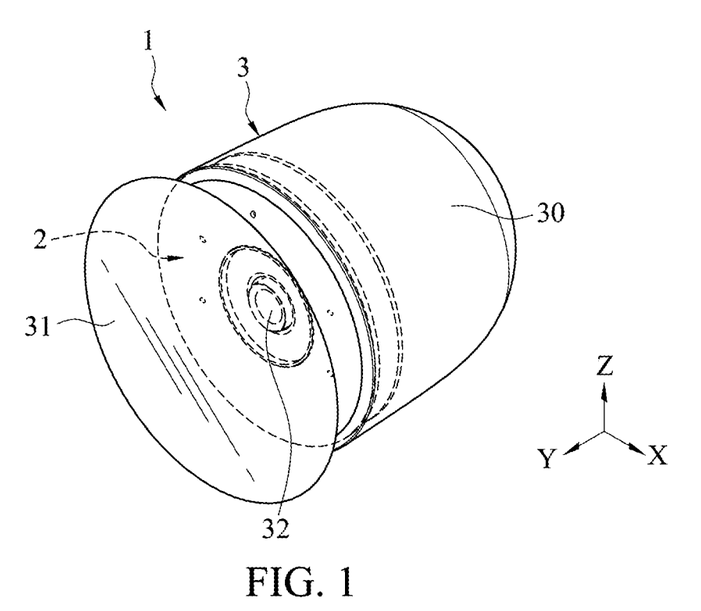
FIG. 1 illustrates a perspective view of a camera according to an exemplary embodiment of the instant disclosure.
Figure 2:
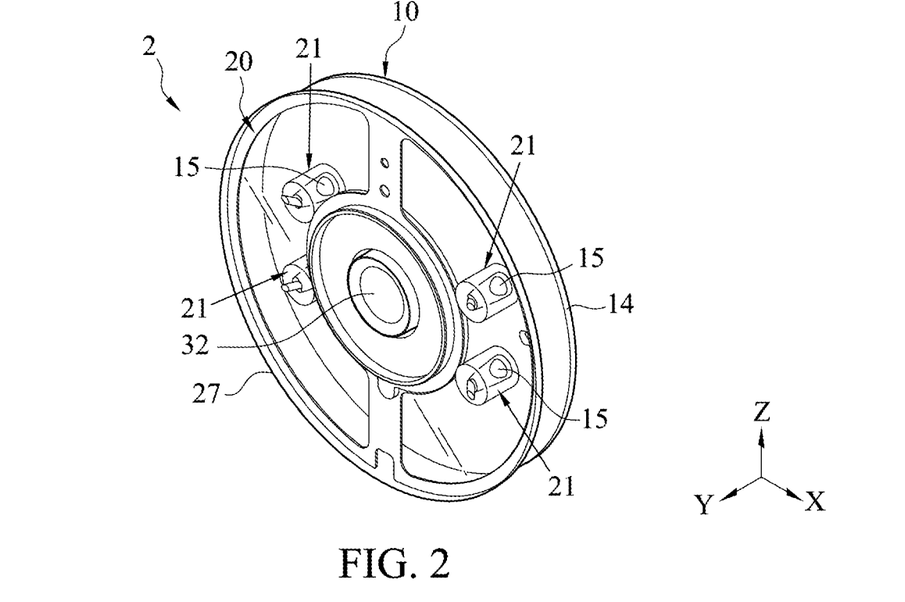
FIG. 2 illustrates a perspective view of a light adjustment module according to a first embodiment of the instant disclosure.
Figure 3:
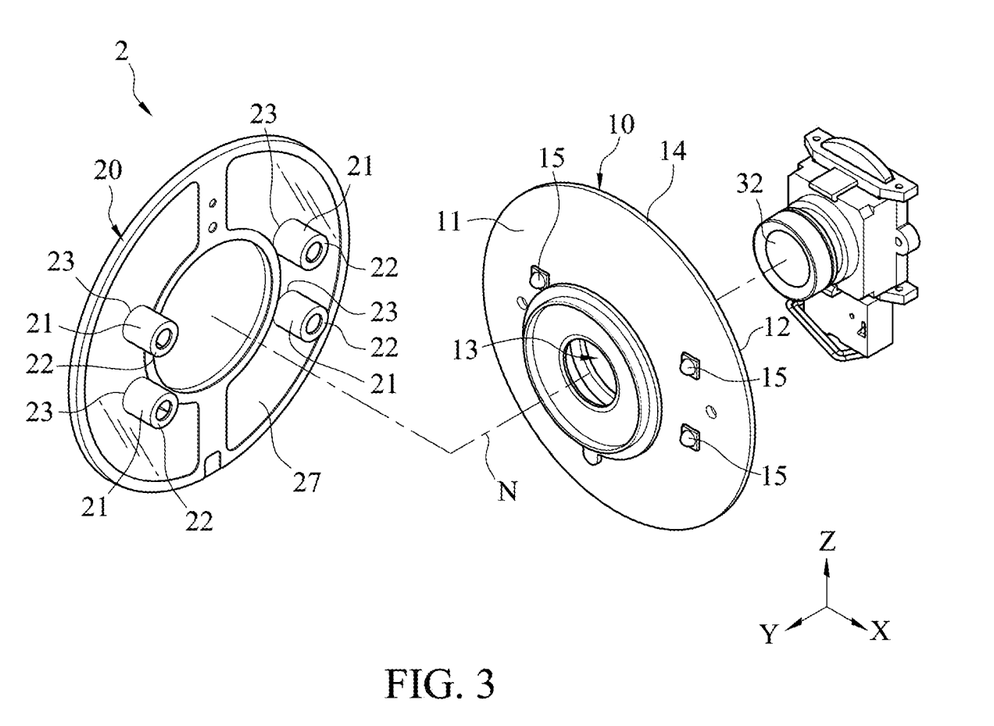
FIG. 3 illustrates an exploded view of the light adjustment module of the first embodiment.
Figure 4:
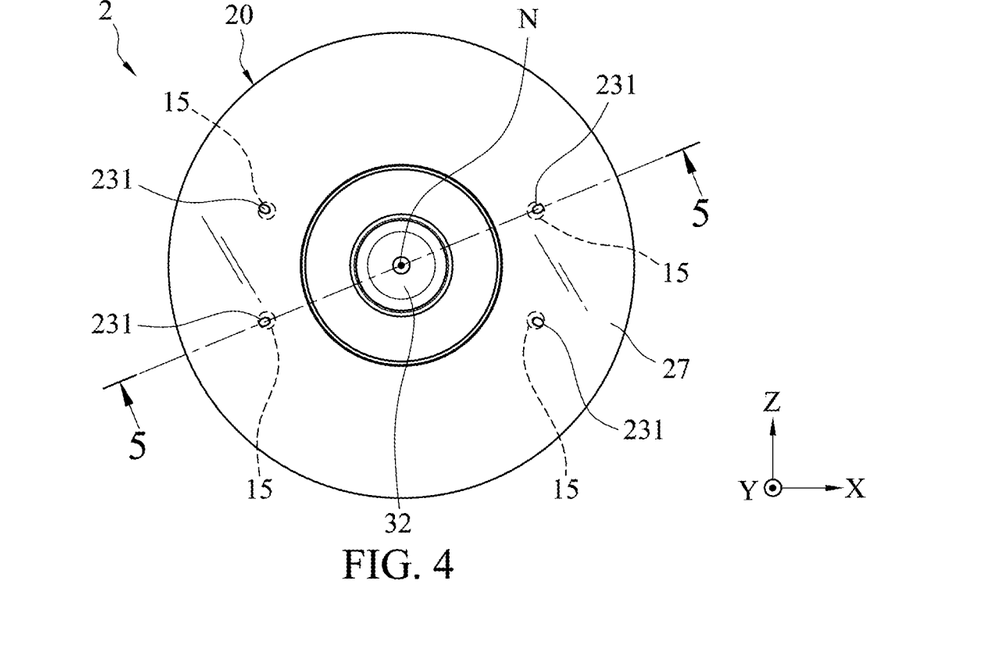
FIG. 4 illustrates a side view of the light adjustment module of the first embodiment.

Embodiments are provided for facilitating the descriptions of the instant disclosure. However, the embodiments are provided as examples for illustrative purpose, but not a limitation to the instant disclosure. In all the figures, same reference numbers designate identical or similar elements. FIG. 1 illustrates a perspective view of a camera according to an exemplary embodiment of the instant disclosure. FIGS. 2 to 4 illustrate a perspective view, an exploded view, and a side view of a light adjustment module according to a first embodiment of the instant disclosure. As shown in FIG. 1, in this embodiment, a camera 1 is provided and the camera 1 comprises a light adjustment module 2 and a camera body 3. In some embodiments, the camera 1 may be an IP camera or network camera, a closed-circuit television (CCTV), an analog monitor camera, etc. The camera 1 may be installed on different fields (e.g., nursey schools, offices, stores, roads, etc.), so that the personnel safety at the field can be monitored or the personnel activities at the field can be recorded.

As shown in FIGS. 1 to 4, the camera body 3 has a housing 30 and a lens 32. The housing 30 is hollowed and has an image capturing opening 31, the lens 32 is in the housing 30 and faces the image capturing opening 31. Lights outside the housing 30 can enter into the housing 30 through the image capturing opening 31, so that the lens 32 can capture images of the outside of the housing 30. The light adjustment module 2 is assembled on the housing 30 and comprises a light source unit 10 and a light adjustment unit 20. The light source unit 10 comprises a substrate 14 and a plurality of light emitting elements 15 disposed around the lens 32. The substrate 14 comprises a first surface 11 and a second surface 12 opposite to the first surface 11. In this embodiment, the substrate 14 is a printed circuit board, and each light emitting element 15 is a light emitting diode (LED). Moreover, in this embodiment, each light emitting element 15 is fixedly disposed on the first surface 11 using surface mount technology (SMT). A normal direction of the first surface 11 of the substrate 14 is parallel to an image capturing direction of the lens 32 (for instance, the Y axis direction shown in FIGS. 3 and 5), such that the light emitting direction of each light emitting element 15 is parallel to the image capturing direction of the lens 32. It is understood that, for each light emitting element 15, the light emitting direction is the maximum luminous intensity direction. In this embodiment, the number of the light emitting elements 15 is four, but embodiments are not limited thereto; according to different needs, the number of the light emitting elements 15 can be altered.

Figure 5:
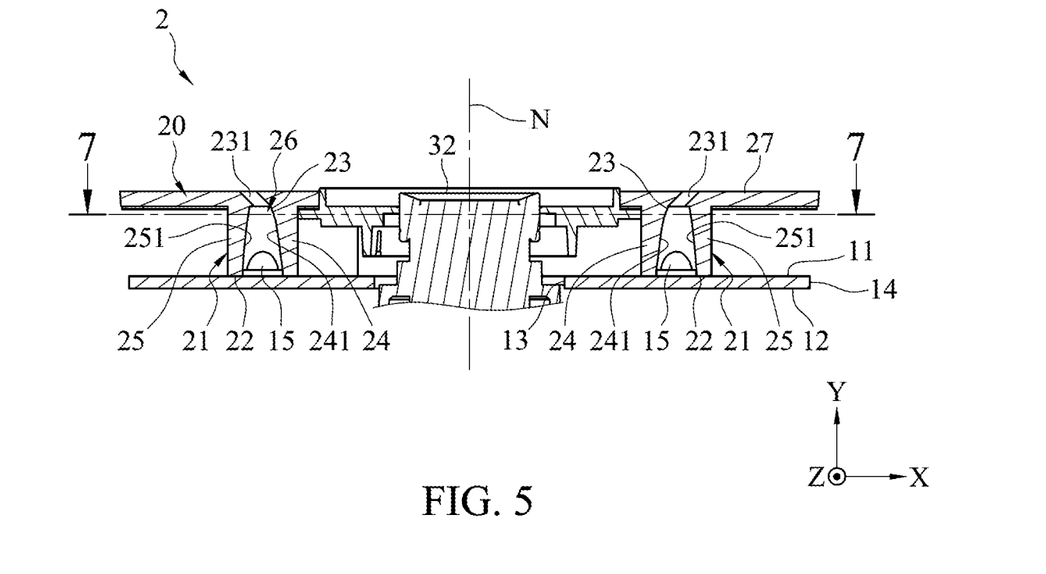
FIG. 5 illustrates a cross-sectional view along line 5-5 shown in FIG. 4.

As shown in FIGS. 3 to 5, the substrate 14 has a lens mount portion 13 for assembling the lens 32. In this embodiment, the lens mount portion 13 is a central through hole, such that the lens 32 is inserted into the lens mount portion 13, but embodiments are not limited thereto. Hence, the lens 32 can be prevented from being shielded and capable of capturing images of the outside of the housing 30. In some embodiments, the lens mount portion 13 of the substrate 14 may be a solid portion, so that the lens 32 can be assembled with the lens mount portion 13 directly and face toward the image capturing opening 31.

As shown in FIGS. 3 to 5, the lens 32 has a normal central axis N (in this embodiment, the axis direction of the normal central axis N is parallel to the Y axis direction shown in FIGS. 2 to 5). The image capturing direction of the lens 32 is the axis direction of the normal central axis N. The plurality of light emitting elements 15 is disposed around the normal central axis N equidistantly. In other words, the shortest distance between each light emitting element 15 and the normal central axis N is the same, but embodiments are not limited thereto. In some embodiments, the positions of the light emitting elements 15 may be arranged differently according to needs. For example, the light emitting elements 15 may be disposed at a same side of the lens mount portion 13, disposed around the normal central axis N equiangularly (e.g., 30 degrees, 45 degrees, or 60 degrees), or disposed irregularly.

As shown in FIGS. 1 to 4, the light adjustment unit 20 is disposed above the light source unit 10 and comprises a plurality of secondary optical elements 21. The secondary optical elements 21 correspond to the light emitting elements 15. A light emitted by each light emitting element 15 is deflected via the corresponding secondary optical element 21. Accordingly, the light emitted by each light emitting element 15 can be emitted to a certain region of the image capturing region of the camera 1. For example, the light emitted by each light emitting element 15 is emitted to one of the quadrants of the image capturing region of the camera 1. In some embodiments, the light adjustment unit 20 and the light source unit 10 are arranged along the image capturing direction of the lens 32 in a side-by-side manner, and the light adjustment unit 20 is located in front of the light source unit 10. The light adjustment unit 20 further comprises a transparent cover 27 disposed on one side of the first surface 11 of the substrate 14. The secondary optical elements 21 are extending from the surface of the transparent cover 27 and respectively correspond to the light emitting elements 15, so that the secondary optical elements 21 are respectively disposed around the normal central axis N equidistantly. In this embodiment, the transparent cover 27 and the secondary optical elements 21 are a one-piece structure (for example, the transparent cover 27 and the secondary optical elements 21 may be integrally formed with each other by injection molding). The transparent cover 27 covers the plurality of light emitting elements 15. The plurality of secondary optical elements 21 is located between the substrate 14 and the transparent cover 27, and the secondary optical elements 21 respectively correspond to the light emitting elements 15. Each secondary optical element 21 has a first end 22 and a second end 23 axially opposite to the first end 22. In this embodiment, the axial direction of each secondary optical element 21 and the image capturing direction of the lens 32 are the same. Moreover, the first end 22 of each secondary optical element 21 is adjacent to the first surface 11, and encloses and covers the corresponding light emitting element 15, and the second end 23 of each secondary optical element 21 is distant from the first surface 11 and connected to the surface of the transparent cover 27. However, it is understood that the aforementioned embodiments are provided for illustrative purposes but not limitations. In some embodiments, the light adjustment unit 20 may be devoid of the transparent cover 27, and the secondary optical elements 21 each enclose and cover the corresponding of light emitting elements 15.

In some embodiments, the transparent cover 27 and each secondary optical element 21 are made of transparent materials. For instance, the transparent materials may be polycarbonate (PC), poly(methyl methacrylate) (PMMA), glass materials, and so on, so that some of the light emitted by each light emitting element 15 can pass the secondary optical elements 21 and the transparent cover 27, and then the light can illuminate outwardly from the image capturing opening 31. Hence, the auxiliary illumination function can be achieved.

In some embodiments, the light adjustment unit 20 can be directly fixed on the substrate 14. For example, each secondary optical element 21 can be fixed on the first surface 11 of the substrate 14 by gluing or engaging. Alternatively, the light adjustment unit 20 may be fixed with the housing 30 of the camera 1 by assembling, embodiments are not limited thereto.

Figure 6:
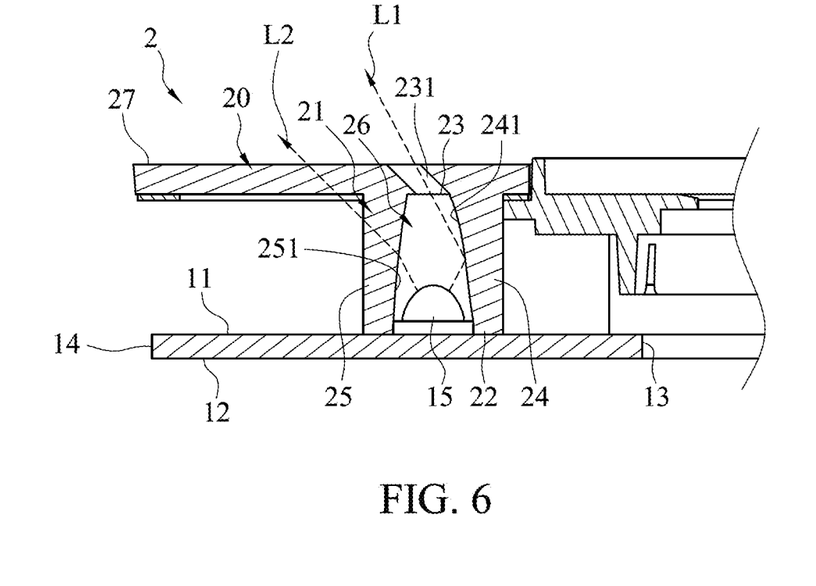
FIG. 6 illustrates an enlarged partial view of FIG. 5.
Figure 7:
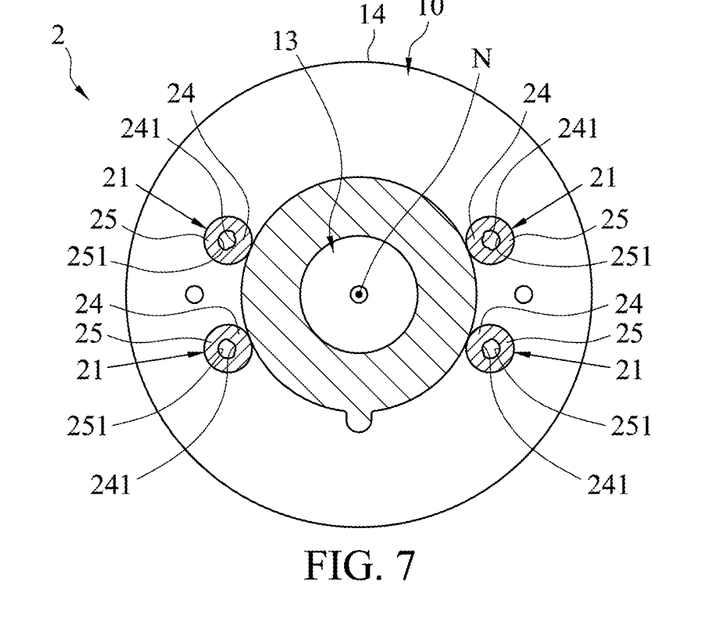
FIG. 7 illustrates a cross-sectional view along line 7-7 shown in FIG. 5.

Please refer to FIGS. 4 to 7. FIG. 5 illustrates a cross-sectional view along line 5-5 shown in FIG. 4; FIG. 6 illustrates an enlarged partial view of FIG. 5; and FIG. 7 illustrates a cross-sectional view along line 7-7 shown in FIG. 5. In this embodiment, each secondary optical element 21 is a cylindrical light-transmittable tube and comprises a first half sidewall 24, a second half sidewall 25, and an axial through hole 26. The first half sidewall 24 and the second half sidewall 25 together form the axial through hole 26 located between the first half sidewall 24 and the second half sidewall 25. The secondary optical elements 21 respectively encloses and covers the light emitting elements 15, such that each light emitting element 15 is located in the corresponding axial through hole 26. For each secondary optical element 21, the inner wall of the first half sidewall 24 has a first inner curved surface 241, and the inner wall of the second half sidewall 25 has a second inner curved surface 251. In other words, the first inner curved surface 241 is the curved surface of the first half sidewall 24 for forming the axial through hole 26, and the second inner curved surface 251 is the curved surface of the second half sidewall 25 for forming the axial through hole 26. Moreover, the first inner curved surface 241 may be all of or a portion of the inner surface of the first half sidewall 24; similarly, the second inner curved surface 251 may be all of or portions of the inner surface of the second half sidewall 25. Specifically, in one embodiment, the curvature of the first inner curved surface 241 of the first half sidewall 24 is different from the curvature of the second inner curved surface 251 of the second half sidewall 25. In some embodiments, the curvature of the first inner curved surface 241 and the curvature of the second inner curved surface 251 may be the axial curvatures, the circumference curvatures, or the combination thereof. Detail description is provided as below.

As shown in FIGS. 4 to 6, for each secondary optical element 21, the distance between the first half sidewall 24 and the normal central axis N is shorter than the distance between the second half sidewall 25 and the normal central axis N (that is, the first half sidewall 24 is much closer to the normal central axis N, as compared with the second half sidewall 25). Moreover, the axial curvatures (namely, the curvatures along the Y axis direction shown in the figures) of the first inner curved surface 241 of the first half sidewall 24 increase from the first end 22 toward the second end 23 for each secondary optical element 21. The axial curvatures (namely, the curvatures along the Y axis direction shown in the figures) of the second inner curved surface 251 of the second half sidewall 25 increase from the first end 22 toward the second end 23 for each secondary optical element 21. For each secondary optical element 21, the axial curvature of the first inner curved surface 241 is different from the axial curvature of the second inner curved surface 251. For example, in this embodiment, the axial curvature of the first inner curved surface 241 closing to the second end 23 is apparently greater than the axial curvature of the second inner curved surface 251 closing to the second end 23 for each secondary optical element 21.

As mentioned above, as shown in FIG. 7, for each secondary optical element 21, the circumference curvature of the first inner curved surface 241 of the first half sidewall 24 is also different from the circumference curvature of the second inner curved surface 251 of the second half sidewall 25. For example, in this embodiment, the circumference curvature of the first inner curved surface 241 is apparently greater than the circumference curvature of the second inner curved surface 251.

According to one or some embodiments of the instant disclosure, each secondary optical element 21 of the light adjustment unit 20 encloses and covers the corresponding light emitting element 15, and the inner walls of each secondary optical element 21 have inner curved surfaces with different curvatures. Hence, each secondary optical element 21 guides the light emitted by the corresponding light emitting element 15 to achieve an expected illumination angle and intensity distribution. For instance, as shown in FIGS. 1 and 6, in this embodiment, since the curvature of the first inner curved surface 241 of the first half sidewall 24 is different from the curvature of the second inner curved surface 251 of the second half sidewall 25, different refraction and/or reflection conditions may be generated when each light emitting element 15 emits light to the first inner curved surface 241 and the second inner curved surface 251. In an example, the curvature of the first inner curved surface 241 of each secondary optical element 21 is designated to allow the refracted light entering into the housing to be decreased and the reflected light coming out of each secondary optical element 21 and the transparent cover 27 to be increased when the corresponding light emitting element 15 emits light to the first inner curved surface 241. Hence, the reflected light (for example, indicated by the arrow L1 shown in the figures) can illuminate a predetermined illumination region and position. In addition, the curvature of the second inner curved surface 251 of each secondary optical element 21 is designated to allow the refracted light coming out of each secondary optical element 21 and the transparent cover 27 to be increased and the reflected entering into the housing 30 to be decreased when the corresponding light emitting element 15 emits light to the second inner curved surface 251. Hence, the refracted light (for example, indicated by the arrow L2 shown in the figures) can illuminate the predetermined illumination region and position. Therefore, most of the light emitted by each light emitting element 15 can illuminate the predetermined illumination region to increase the brightness. Furthermore, the light emitted by each light emitting element 15 can be guided by the corresponding secondary optical element 21 to the expected illumination angle and positon, so that the light illuminates the predetermined region of the image capturing region. Accordingly, the brightness in the predetermined illumination region can be uniform, thereby greatly enhancing the image quality of the captured image.

Figure 8:
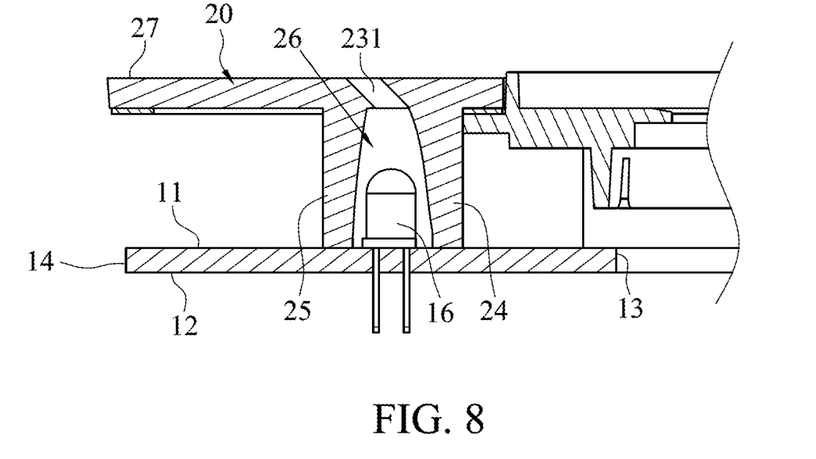
FIG. 8 illustrates a partial cross-sectional view of a light adjustment module according to a second embodiment of the instant disclosure.

Moreover, according to one or some embodiments of the instant disclosure, the light illumination can be controlled by each secondary optical element 21 enclosing and covering the corresponding light emitting element 15. Hence, additional manufacturing processes (e.g., the pin-bending and turning procedure) for each light emitting element 15 are not necessarily required. As shown in FIGS. 3 to 7, in this embodiment, each light emitting element 15 is a surface-mount technology (SMT) LED, such that each light emitting element 15 can be attached on the first surface 11 of the substrate 14 quickly during the manufacturing, thereby greatly reducing labor and time cost. Alternatively, as shown in FIG. 8, FIG. 8 illustrates a partial cross-sectional view of a light adjustment module according to a second embodiment of the instant disclosure. In this embodiment, each light emitting element 16 is an insertion-type LED. Since the light controlling is achieved by the light adjustment unit 20, each light emitting element 16 can be inserted and fixed on the substrate 14 without the foregoing pin-bending procedure during the manufacturing. Hence, labor and time cost can be reduced as well.

Further, as shown in FIGS. 4 to 6, in some embodiments, the transparent cover 27 further comprises a light emitting hole 231 at the second end 23 of each secondary optical element 21. Each light emitting hole 231 is in communication with the axial through hole 26 of the corresponding secondary optical element 21 and is defined through the transparent cover 27. Accordingly, portions of the light emitted by each light emitting element 15 is emitted through the corresponding light emitting hole 231 directly and the light energy loss can be reduced, thereby further enhancing the brightness at the predetermined illumination region. Moreover, as shown in FIGS. 4 to 6, in some embodiments, the light emitting hole 231 of each secondary optical element 21 may be an inclined hole. For example, the inclined direction of the light emitting hole 231 may be extending toward the predetermined illumination region of the image capturing region, so that the light emitted through the light emitting hole 231 can be guided to illuminate the predetermined illumination region directly, thereby further reducing the light energy loss.

Figure 9:
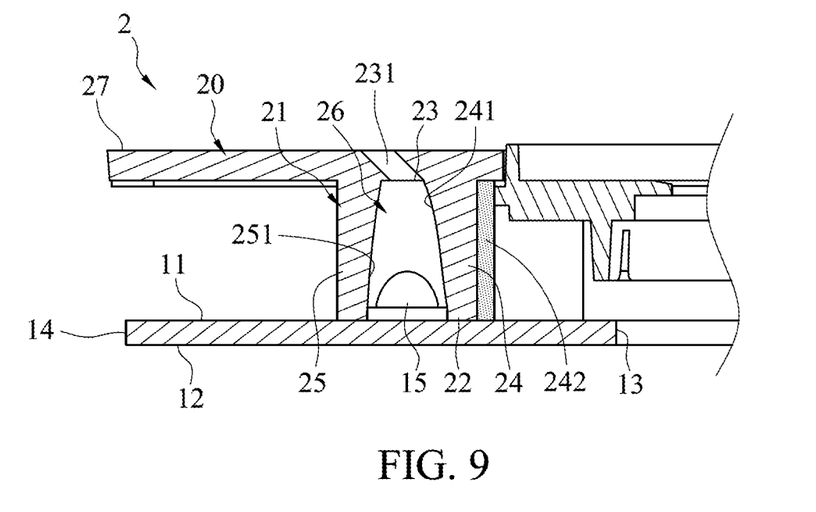
FIG. 9 illustrates a partial cross-sectional view of a light adjustment module according to a third embodiment of the instant disclosure.

As shown in FIG. 9, FIG. 9 illustrates a partial cross-sectional view of a light adjustment module according to a third embodiment of the instant disclosure. In this embodiment, a protecting layer 242 is further disposed on each first half sidewall 24. Specifically, in this embodiment, the protecting layer 242 is disposed on the outer wall of the first half sidewall 24, but embodiments are not limited thereto. Accordingly, the light emitted by each light emitting element 15 can be blocked by the protecting layer 242 after the light illuminates each first inner curved surface 241, so that the protecting layer 242 prevents the light emitted by each light emitting element 15 from entering into the lens 32. In some embodiments, the protecting layer 242 may be made by deep color materials, for example, deep color films or sheets, for blocking the light. Alternatively, the protecting layer 242 may be made by reflective materials, for example, reflection films or sheets, for reflecting the light refracted into the first half sidewall 241. Hence, the light coming out of each secondary optical element 21 and the transparent cover 27 can be increased, thereby enhancing the brightness at the predetermined illumination region.

Figure 10:
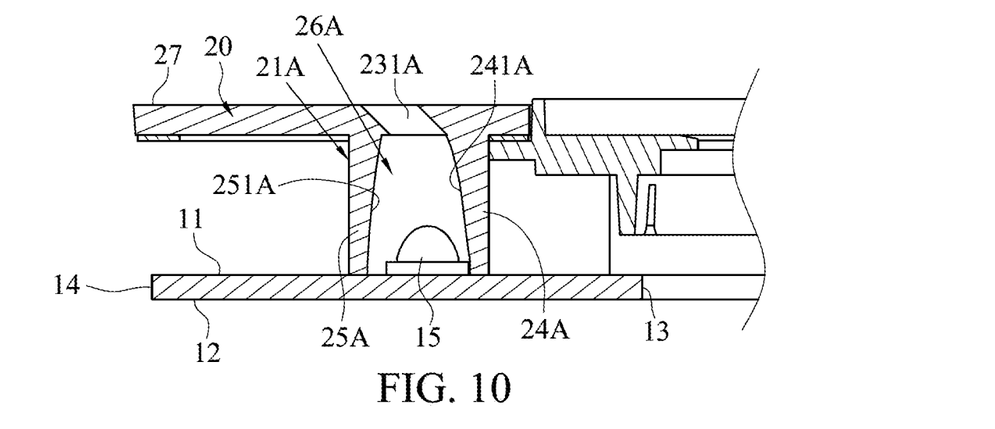
FIG. 10 illustrates a partial cross-sectional view of a light adjustment module according to a fourth embodiment of the instant disclosure.

In some embodiments, according to one or some embodiments of the instant disclosure, the position of each light emitting element 15 in the axial through hole 26 of the corresponding secondary optical element 21 can be adjusted, so that the illumination angle and the intensity distribution of the light emitted by each light emitting element 15 and coming out of the image capturing opening 31 can be adjusted. As shown in FIG. 10, FIG. 10 illustrates a partial cross-sectional view of a light adjustment module according to a fourth embodiment of the instant disclosure. The hole size of the axial through hole 26A of each secondary optical element 21A in this embodiment is greater than the hole size of the axial through hole 26 of each secondary optical element 21 in the embodiment shown in FIG. 6. Moreover, in this embodiment, each light emitting element 15 is located in the axial through hole 26A of the corresponding secondary optical element 21A with an eccentric configuration. For example, in this embodiment, the light emitting element 15 is closer to the first inner curved surface 241A of the first half sidewall 24A of the secondary optical element 21A and farer from the second inner curved surface 251A of the second half sidewall 25A of the secondary optical element 21A. Therefore, the illumination angle of each light emitting element 15 to the first inner curved surface 241A and the second inner curved surface 251A can be changed to generate different refraction and/or reflection effect, thereby changing the illumination angle and the intensity distribution of the light coming out of the image capturing opening 31. Moreover, in this embodiment, the size of the light emitting hole 231A increases along with the increase of the size of the axial through hole 26A, thus increasing the light amount coming out of the image capturing opening 31.

Figure 11:
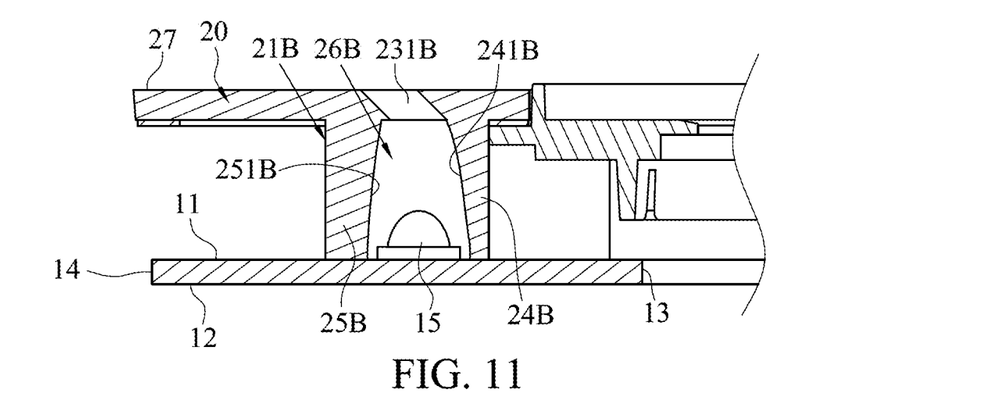
FIG. 11 illustrates a partial cross-sectional view of a light adjustment module according to a fifth embodiment of the instant disclosure.

In some embodiments, according to one or some embodiments of the instant disclosure, for each secondary optical element 21, the wall thicknesses of the first half sidewall 24, the second half sidewall 25, or the combination thereof can be adjusted. Hence, the illumination angle and the intensity distribution of the light emitted by each light emitting element 15 and coming out of the image capturing opening 31 can be adjusted. As shown in FIG. 11, FIG. 11 illustrates a partial cross-sectional view of a light adjustment module according to a fifth embodiment of the instant disclosure. As compared with the embodiment shown in FIG. 6, for each secondary optical element 21, the second half sidewall 25B has a thicker wall thickness, and the first half sidewall 24B has a thinner wall thickness, and the wall thickness of the second half sidewall 25B is greater than the wall thickness of the first half sidewall 24B. Hence, the size of the axial through hole 26B can be changed. Moreover, in this embodiment, each light emitting element 15 is spaced from the first inner curved surface 241B of the first half sidewall 24B of the corresponding secondary optical element 21B; similarly, each light emitting element 15 is spaced from the second inner curved surface 251B of the second half sidewall 25B of the corresponding secondary optical element 21B. Accordingly, different refraction and/or reflection conditions may be generated when each light emitting element 15 emits light to the first inner curved surface 241B and the second inner curved surface 251B, so that the illumination angle and the intensity distribution of the light coming out of the image capturing opening 31 can be changed. Moreover, in this embodiment, the size of the light emitting hole 231B increases along with the increasing of the size of the axial through hole 26B, thereby increasing the light amount coming out of the image capturing opening 31.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A light adjustment module for camera is applicable to a camera, the light adjustment module comprising:
   a light source unit comprising a plurality of light emitting elements disposed around a lens of the camera, wherein a light emitting direction of each of the light emitting elements is parallel to an image capturing direction of the lens; and
   a light adjustment unit disposed above the light source unit and comprising a plurality of secondary optical elements, wherein the secondary optical elements respectively corresponds to the light emitting elements;
   wherein a light emitted by each of the light emitting elements is deflected through the corresponding secondary optical element;
   wherein the secondary optical elements each comprise a first half sidewall and a second half sidewall surrounding the corresponding light emitting element, an inner wall of the first half sidewall has a first inner curved surface, an inner wall of the second half sidewall has a second inner curved surface, and a curvature of the first inner curved surface is different from a curvature of the second inner curved surface.

2. The light adjustment module for camera according to claim 1, wherein the light source unit comprises a substrate, the substrate comprises a first surface and a second surface opposite to the first surface, and the light emitting elements are fixedly disposed on the first surface.

3. The light adjustment module for camera according to claim 2, wherein the secondary optical elements each have a first end and a second end axially opposite to the first end, and the first ends are adjacent to the first surface.

4. The light adjustment module for camera according to claim 1, wherein the lens has a normal central axis, for at least one of the secondary optical elements, a distance between the first half sidewall and the normal central axis is shorter than a distance between the second half sidewall and the normal central axis, and the curvature of the first inner curved surface of the first half sidewall is greater than the curvature of the second inner curved surface of the second half sidewall.

5. The light adjustment module for camera according to claim 1, wherein the first half sidewall and the second half sidewall together form an axial through hole located between the first half sidewall and the second half sidewall.

6. The light adjustment module for camera according to claim 1, wherein the light adjustment unit comprises a transparent cover, and the secondary optical elements is extending from a surface of the transparent cover.

7. A camera comprising:
a camera body having a lens; and
a light adjustment module for camera according to claim 1, wherein the light adjustment module is disposed in the camera body.

8. The camera according to claim 7, wherein the light source unit comprises a substrate, the substrate comprises a first surface and a second surface opposite to the first surface, and the light emitting elements are fixedly disposed on the first surface.

9. The camera according to claim 8, wherein the secondary optical elements each have a first end and a second end axially opposite to the first end, and the first ends are adjacent to the first surface.

10. The camera according to claim 7, wherein the lens has a normal central axis, for at least one of the secondary optical elements, a distance between the first half sidewall and the normal central axis is shorter than a distance between the second half sidewall and the normal central axis, and the curvature of the first inner curved surface of the first half sidewall is greater than the curvature of the second inner curved surface of the second half sidewall.

11. The camera according to claim 10, wherein a protecting layer is further disposed on the first half sidewall of each of the secondary optical elements.

12. The camera according to claim 7, wherein the secondary optical elements each have a first end and a second end axially opposite to the first end, the curvatures of each of the first inner curved surfaces increase from the first end toward the second end, and the curvatures of each of the second inner curved surfaces increase from the first end toward the second end.

13. The camera according to claim 7, wherein the first half sidewall and the second half sidewall together form an axial through hole located between the first half sidewall and the second half sidewall.

14. The camera according to claim 13, wherein the light emitting elements each are eccentrically located in the corresponding axial through hole.

15. The camera according to claim 7, wherein for each of the secondary optical elements, a wall thickness of the first half sidewall is different from a wall thickness of the second half sidewall.

16. The camera according to claim 7, wherein the light adjustment unit comprises a transparent cover, and the secondary optical elements is extending from a surface of the transparent cover.

17. The camera according to claim 16, wherein the transparent cover comprises a plurality of light emitting holes respectively corresponding to the secondary optical elements.

18. The camera according to claim 7, wherein the light emitting elements each are a surface-mount technology light emitting diode.

19. A camera comprising:
a camera body having a lens; and
a light adjustment module for camera, wherein the light adjustment module is disposed in the camera body, and wherein the light adjustment module comprises:
a light source unit comprising a plurality of light emitting elements disposed around the lens of the camera, wherein a light emitting direction of each of the light emitting elements is parallel to an image capturing direction of the lens; and
a light adjustment unit disposed above the light source unit and comprising a plurality of secondary optical elements, wherein the secondary optical elements respectively corresponds to the light emitting elements, and the secondary optical elements each enclose and cover the corresponding of light emitting elements;
wherein a light emitted by each of the light emitting elements is deflected through the corresponding secondary optical element.

20. The camera according to claim 19, wherein the light source unit comprises a substrate, the substrate comprises a first surface and a second surface opposite to the first surface, and the light emitting elements are fixedly disposed on the first surface.

21. The camera according to claim 20, wherein the secondary optical elements each have a first end and a second end axially opposite to the first end, and the first ends are adjacent to the first surface.

22. The camera according to claim 19, wherein the secondary optical elements each comprise a first half sidewall and a second half sidewall surrounding the corresponding light emitting element, an inner wall of the first half sidewall has a first inner curved surface, an inner wall of the second half sidewall has a second inner curved surface, and a curvature of the first inner curved surface is different from a curvature of the second inner curved surface.

23. The camera according to claim 22, wherein a protecting layer is further disposed on the first half sidewall of each of the secondary optical elements.

24. The camera according to claim 22, wherein the first half sidewall and the second half sidewall together form an axial through hole located between the first half sidewall and the second half sidewall, and the light emitting elements each are eccentrically located in the corresponding axial through hole.

25. The camera according to claim 19, wherein the light adjustment unit comprises a transparent cover, and the secondary optical elements is extending from a surface of the transparent cover.

26. The camera according to claim 25, wherein the transparent cover comprises a plurality of light emitting holes respectively corresponding to the secondary optical elements.

27. The camera according to claim 19, wherein the light emitting elements each are a surface-mount technology light emitting diode.

\* \* \* \* \*